(12) United States Patent
Kong et al.

(10) Patent No.: US 8,020,081 B2
(45) Date of Patent: Sep. 13, 2011

(54) MULTI-LEVEL CELL MEMORY DEVICES USING TRELLIS CODED MODULATION AND METHODS OF STORING DATA IN AND READING DATA FROM THE MEMORY DEVICES

(75) Inventors: Jun Jin Kong, Yongin-si (KR); Sung Chung Park, Yongin-si (KR); Yun Tae Lee, Yongin-si (KR); Young Hwan Lee, Yongin-si (KR); Si Hoon Hong, Yongin-si (KR); Jae Woong Hyun, Yongin-si (KR); Dong Ku Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1148 days.

(21) Appl. No.: 11/802,334

(22) Filed: May 22, 2007

(65) Prior Publication Data
US 2008/0137413 A1    Jun. 12, 2008

(30) Foreign Application Priority Data
Dec. 6, 2006 (KR) .................. 10-2006-0123340

(51) Int. Cl.
*H03M 13/03* (2006.01)
(52) U.S. Cl. ......... 714/786; 714/797; 714/763; 714/779
(58) Field of Classification Search .................. 714/785, 714/786, 792, 758, 763, 766, 768, 773, 779
See application file for complete search history.

(56) References Cited

U.S. PATENT DOCUMENTS

| | | | | |
|---|---|---|---|---|
| 6,765,967 B2 * | 7/2004 | Dowling | ...................... | 375/254 |
| 7,173,962 B2 * | 2/2007 | Dowling | ...................... | 375/222 |
| 2007/0171714 A1 * | 7/2007 | Wu et al. | .................. | 365/185.09 |
| 2007/0171730 A1 * | 7/2007 | Ramamoorthy et al. | | 365/185.33 |

* cited by examiner

*Primary Examiner* — Fritz Alphonse
(74) *Attorney, Agent, or Firm* — Harness, Dickey & Pierce, P.L.C.

(57) ABSTRACT

A multi-level cell (MLC) memory device may include: a MLC memory cell; an outer encoder that encodes data using a first encoding scheme to generate an outer encoded bit stream; and a trellis coded modulation (TCM) modulator that applies a program pulse to the MLC memory cell to write the data in the MLC memory cell. The program pulse may be generated by TCM modulating the outer encoded bit stream. A method of storing data in a MLC memory device, reading data from the MLC memory device, or storing data in and reading data from the MLC memory device may include: encoding data using a first encoding scheme to generate an outer encoded bit stream; and applying a program pulse to a MLC memory cell of the MLC memory device to write the data in the MLC memory cell. The program pulse may be generated by TCM modulating the outer encoded bit stream.

21 Claims, 7 Drawing Sheets

MULTI-LEVEL CELL MEMORY DEVICES USING TRELLIS CODED MODULATION AND METHODS OF STORING DATA IN AND READING DATA FROM THE MEMORY DEVICES

PRIORITY STATEMENT

This application claims priority from Korean Patent Application No. 10-2006-0123340, filed on Dec. 6, 2006, in the Korean Intellectual Property Office (KIPO), the entire contents of which are incorporated herein by reference.

BACKGROUND

1. Field

Example embodiments relate to semiconductor memory devices using Trellis coded modulation (TCM), methods of storing data in the memory devices, and methods of reading data from the memory devices. Also, example embodiments relate to multi-level cell (MLC) memory devices using TCM, methods of storing data in the MLC memory devices, and methods of reading data from the MLC memory devices.

2. Description of Related Art

A single-level cell (SLC) memory device stores one bit of data in a single memory cell. The SLC memory device also is referred to as a single-bit cell (SBC) memory.

FIG. 1 illustrates a cell threshold voltage distribution of a SLC memory device according to related art. As shown in FIG. 1, the SLC memory device stores and reads data of one bit at a voltage level included in two distributions divided by a threshold voltage level programmed in a memory cell. For example, when a voltage level read from the memory cell is greater than 0.5 volts and less than 1.5 volts, it is determined that the data stored in the memory cell has a logic value of "1". When the voltage level read from the memory cell is greater than 2.5 volts and less than 3.5 volts, it is determined that the data stored in the memory cell has a logic value of "0". The data stored in a memory cell is classified depending on the difference(s) between cell currents and/or cell voltages during the reading operations.

Meanwhile, a MLC memory device that can store data of two or more bits in a single memory cell has been proposed in response to a need for higher integration of memory. The MLC memory device also is referred to as a multi-bit cell (MBC) memory. However, as the number of bits stored in the single memory cell increases, reliability deteriorates and read-failure rate increases. To store 'm' bits in a single memory cell, $2^m$ voltage level distributions are required. But since the voltage window for a memory cell is limited, the difference in threshold voltage between adjacent bits decreases as 'm' increases, causing the read-failure rate increases. For this reason, it is not easy to improve storage density using a MLC memory device.

Accordingly, it may be desirable to develop MLC memory devices, methods of storing data in the MLC memory devices, and/or methods of reading data from the MLC memory devices.

SUMMARY

Example embodiments may provide semiconductor memory devices using TCM that may have improved storage density. In addition, example embodiments may provide MLC memory devices using TCM that may have improved storage density.

Also, example embodiments may provide methods of storing data in memory devices using TCM that may have improved storage density. And example embodiments may provide methods of storing data in MLC memory devices using TCM that may have improved storage density.

Additionally, example embodiments may provide methods of reading data from memory devices using TCM that may have improved storage density. Further, example embodiments may provide methods of reading data from MLC memory devices using TCM that may have improved storage density.

According to example embodiments, a MLC memory device may include: a MLC memory cell; an outer encoder that encodes data using a first encoding scheme to generate an outer encoded bit stream; and a TCM modulator that applies a program pulse to the MLC memory cell to write the data in the MLC memory cell. The program pulse may be generated by TCM modulating the outer encoded bit stream.

According to example embodiments, a method of storing data in a MLC memory device may include: encoding data using a first encoding scheme to generate an outer encoded bit stream; and applying a program pulse to a MLC memory cell of the MLC memory device to write the data in the MLC memory cell. The program pulse may be generated by Trellis coded modulation of the outer encoded bit stream.

According to example embodiments, a method of reading data from the MLC memory device may include: receiving an output pulse from a MLC memory cell of the MLC memory device; and generating an inner decoded bit stream from the output pulse in response to application of a read signal.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
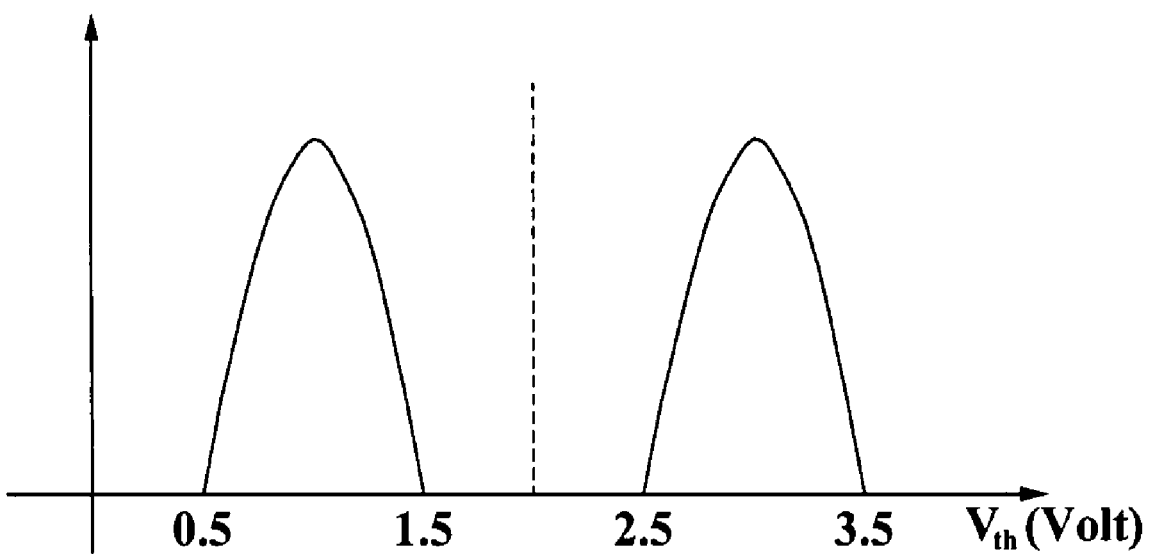
FIG. 1 illustrates a cell threshold voltage distribution of a SLC memory device according to related art.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," or "coupled to" to another component, it may be directly on, connected to, or coupled to the other component or intervening components may be present.

In contrast, when a component is referred to as being "directly on," "directly connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
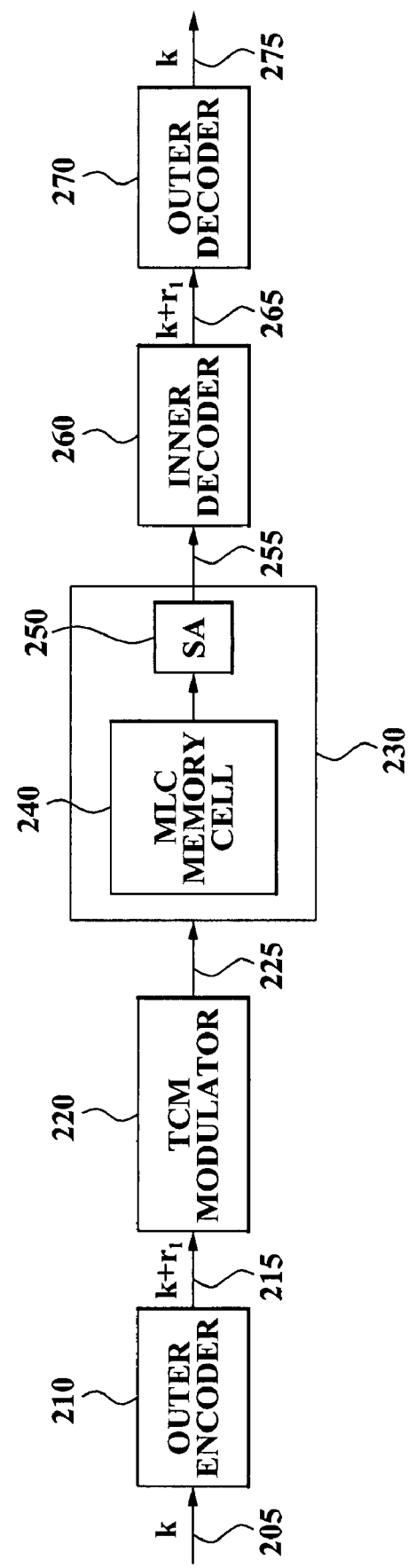
FIG. 2 is a block diagram illustrating a MLC memory device according to an example embodiment.

FIG. 2 is a block diagram illustrating a MLC memory device according to an example embodiment.

The MLC memory device may include an outer encoder 210, a TCM modulator 220, a MLC memory cell array 230, an inner decoder 260, and/or an outer decoder 270.

As shown in FIG. 2, the example embodiment may utilize a concatenated coding where an outer coding and an inner coding may be concatenated to store and/or read data in the MLC memory device. In this instance, block coding may be utilized for the outer coding, and/or TCM coding may be utilized for the inner coding. The block coding may correspond to a scheme of encoding and/or decoding data into certain block units. The TCM may be a scheme that utilizes Trellis coding and/or performs both encoding and signal mapping. The TCM may be configured by performing both the encoding and the signal mapping to maximize a minimum Euclidian distance of signal sequences to be encoded. The block coding may be robust for detecting and/or correcting burst error or errors, and/or the TCM may be robust for detecting and/or correcting random error or errors. As described above, in the example embodiments, when storing data in the MLC memory device, block coding may be utilized for the outer coding, and/or TCM coding may be utilized for the inner coding. Therefore, according to example embodiments, an improved error correction performance robust against both burst error or errors and random error or errors may be provided.

The outer encoder 210 may receive source data to store in the MLC memory device, and/or may encode the data using a first encoding scheme, and thereby may generate an outer encoded bit stream 215. In this instance, the first encoding scheme may utilize a linear block encoding.

Examples of linear block encoding include Hamming coding; Bose, Ray-Chaudhuri, Hocquenghem (BCH) coding; Reed-Solomon (RS) coding; and Golay coding. The linear block encoding may block source data into k-bit units. For example, the source data may be divided into the k-bit units. The outer encoder 210 may add an $r_1$ bit or bits of overhead to a blocked k-bit bit stream 205 in order to generate k+$r_1$ bits of the outer encoded bit stream 215. Therefore, a code rate of the outer encoder 210 may become k/(k+$r_1$). The added $r_1$ bit or bits may be added to the k-bit bit stream 205 as a parity bit or bits. In this case, when data is read from the MLC memory device, the inner decoder 260 may detect an error or errors in the k-bit data and/or may correct the detected error or errors by referring to the $r_1$ bit or bits.

The TCM modulator 220 may apply a program pulse to the MLC memory cell 240 to write the data in the MLC memory cell 240, the program pulse being generated by TCM modulating the outer encoded bit stream 215. The TCM modulator 220 may be referred to as a TCM mapper. The TCM modulator 220 may perform both the encoding and the signal mapping. The encoding may utilize Trellis coding, and/or the signal mapping may utilize set portioning provided, for example, by Ungerboeck.

The TCM modulator 220 may encode k+$r_1$ bits of the outer encoded bit stream 215 and thereby may generate k+$r_1$+$r_2$ bits of the inner encoded bit stream 225. Therefore, an $r_2$ bit or bits of overhead may be added by the TCM modulator 220 and/or a code rate of the TCM modulator 220 may become (k+$r_1$)/(k+$r_1$+$r_2$). When 'n' is utilized for k+$r_1$+$r_2$, the code rate of the outer encoder 210 and/or the TCM modulator 220 may become k/n. The TCM may be advantageous for detecting and/or correcting random error or errors.

The inner encoded bit stream 225 may be stored in the MLC memory cell 240 by the TCM modulator 220. For example, the inner encoded bit stream 225 may correspond to final digital data that is stored in the MLC memory cell 240. In this instance, the inner encoded bit stream 225 may include 'n' bits. When a 'k' bit corresponding to a predetermined number of the 'n' bits may maintain a value of the k-bit bit stream 205 as is, the inner encoded bit stream 225 is referred to as a systematic code. Conversely, when any of the n-bit inner encoded bit stream 225 may not maintain the value of the k-bit bit stream 205 as is, the inner encoded bit stream 225 is referred to as a nonsystematic code. As described above, according to example embodiments, the inner encoded bit stream 225 may be a systematic code and/or a nonsystematic code. When the inner encoded bit stream 225 is a systematic code, the data stored in the MLC memory cell 240 also may be stored while maintaining the value of the k-bit bit stream 205 as is.

The TCM modulator 220 may perform both the signal mapping and the encoding. The TCM modulator 220 may apply the program pulse according to the inner encoded bit stream 225 to the MLC memory cell 240 to write the data in the MLC memory cell 240, where the program pulse may be generated, for example, by TCM modulating the outer encoded bit stream 215. The MLC memory cell 240 may be an m-bit MLC memory cell, and the program pulse may be any one of $2^m$ number of levels corresponding to $2^m$ number of bit streams that may be generated by combination of the m-bits. The program pulse may be generated by pulse amplitude modulation (PAM).

The MLC memory cell array 230 may include a plurality of MLC memory cells 240 and/or sense amplifiers (SA) 250. The sense amplifier(s) 250 may receive a signal about the data stored in the MLC memory cell 240, and/or may amplify the received signal. The MLC memory cell 240 may correspond to a memory cell of a MLC flash memory cell.

The inner decoder 260 may generate an inner decoded bit stream 265 from an output pulse 255 in response to application of a read signal, where the output pulse 255 may be output from the MLC memory cell 240. For example, the inner decoder 260 may perform both signal demapping and decoding corresponding to the TCM modulator 220. The inner decoder 260 may include the signal demapping and/or the decoding.

The inner decoder 260 may generate a demapped bit stream from the output pulse 255 in response to application of the read signal, where the output pulse 255 may be output from the MLC memory cell 240. Also, the inner decoder 260 may decode the demapped bit stream using Viterbi decoding and thereby may generate the inner decoded bit stream 265. When the MLC memory cell 240 is an m-bit MLC memory cell, the inner decoder 260 may compare the output pulse 255 with a threshold value of $2^m$ number of distributions and thereby may generate the demapped bit stream corresponding to the output pulse 255.

The inner decoder 260 may generate the demapped bit stream from the output pulse 255 by performing either a hard decision or a soft decision. The hard decision may definitely decide whether a value of each of the bits of the demapped bit stream from the output pulse 255 of the inner decoder 260 is "0" or "1". The soft decision may indefinitely decide whether a value of each of the bits of the demapped bit stream from the output pulse 255 of the inner decoder 260 is "0" or "1". For example, the soft decision may indefinitely decide the value, such as "definitely 0", "0 but unsure", and the like. Accordingly, when the inner decoder 260 performs the soft decision, the outer decoder 270 and the like may decide a value of each of bits by referring to information received from the inner decoder 260. According to example embodiments, a signal demapping module in the inner decoder 260 may perform the soft decision, and thereby a decoding module may definitely decide a value of each of the bits of the demapped bit stream.

When the inner decoder 260 performs the soft decision, the demapped bit stream generated by the inner decoder 260 generally may include more bits than 'n' ($=k+r_1+r_2$) bits of the inner encoded bit stream 225. Also, an additional bit may include information about accuracy of the decided value of each of the bits.

The inner decoder 260 may decode the demapped bit stream using a decoding scheme corresponding to the TCM modulator 220 and thereby may generate an inner decoded bit stream 265. For example, the decoding scheme may utilize Viterbi decoding. The inner decoder 260 may decode $k+r_1+r_2$ bits of the demapped bit stream and thereby may generate $k+r_1$ bits of the inner decoded bit stream 265. The inner decoder 260 may detect an error or errors included in the demapped bit stream using, for example, a Viterbi decoding scheme, and/or may correct the detected error or errors.

The outer decoder 270 may decode the inner decoded bit stream 265 using a first decoding scheme and thereby may generate the outer decoded bit stream 275.

Outer decoder 270 may detect an error or errors from the inner decoded bit stream 265 using the first decoding scheme, and/or may correct the detected error or errors. For example, the first decoding scheme may utilize a decoding scheme corresponding to the first encoding scheme. For example, when the first encoding scheme utilizes linear block encoding, such as Hamming coding, BCH coding, RS coding, and/or Golay coding, the first decoding scheme also may utilize a corresponding linear block decoding. For example, when the first encoding scheme utilizes an encoding according to RS coding, the decoding scheme also may utilize a decoding according to RS coding. When linear block coding is utilized, the outer decoder 270 may be advantageous for detecting and/or correcting burst error or errors.

As described above, the inner decoder 260 may correct an error or errors detected from the demapped bit stream and thereby may generate the inner decoded bit stream 265. The outer decoder 270 may correct an error or errors detected from the inner decoded bit stream 265 and thereby may generate the outer decoded bit stream 275. For example, error detection and/or correction including two operations may be performed. Therefore, according to example embodiments, a read signal when data is read from a MLC memory device may be more accurately read and thus a high storage density MLC memory device may be achieved.

Error detection and/or error correction may have different capabilities depending on the decoding scheme. For example, while error detection may be possible up to four bits, error correction may be possible up to only three bits. In this instance, when four bits of an error occur, the outer decoder 270 may detect the error, however the outer decoder 270 may not correct the detected error (or errors). In this case, the outer decoder 270 may report the error that is (or the errors that are) detected but uncorrected to an object, for example, an operating system, a memory management program, and the like, that receives the outer decoded bit stream 275. The object may perform an additional operation based on the report and may more effectively utilize the memory.

Figure 3:
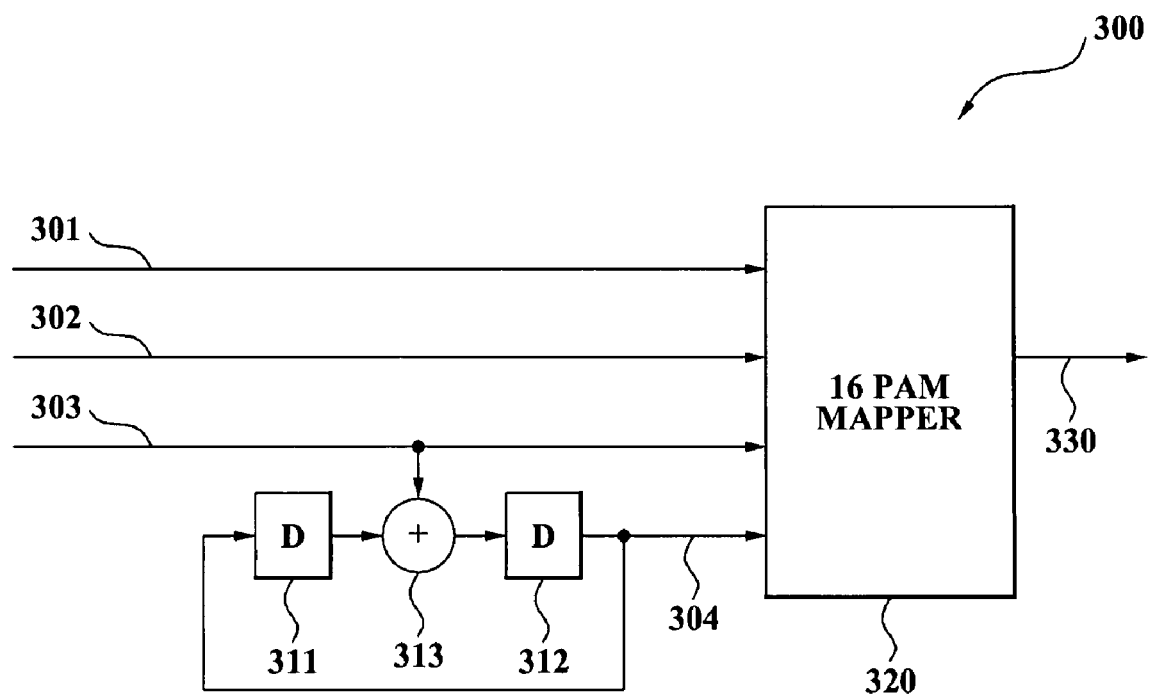
FIG. 3 is a block diagram illustrating a TCM modulator according to an example embodiment.

FIG. 3 is a block diagram illustrating a TCM modulator according to an example embodiment.

The TCM modulator 300 may include a 16 PAM mapper 320, two D-flipflop 311 and 312, and/or an exclusive-OR operation module 313.

FIG. 3 illustrates an example of the TCM modulator 300 when an outer encoded bit stream may be three bits 301, 302, 303, and/or a MLC memory cell may be a four-bit MLC memory cell. For example, an outer encoder 210 of FIG. 2 may add a one-bit parity bit to a two-bit input bit stream and thereby may generate three-bit outer encoded bit stream including three bits 301, 302, and 303. The TCM modulator 300 may generate an additional bit 304 using a previous value of a single bit 303 among the three bits 301, 302, and 303 of the outer encoded bit stream. In this instance, the additional bit 304 may be generated by performing an exclusive-OR operation with respect to a value of the bit 303 and/or a value of the D-flipflop 311 in the exclusive-OR module 313. Also, the additional bit 304 may be stored in the D-flipflop 312, may be shifted to the D-flipflop 311 in a subsequent clock, and/or may be involved in generating one or more subsequent bits.

Figure 6:
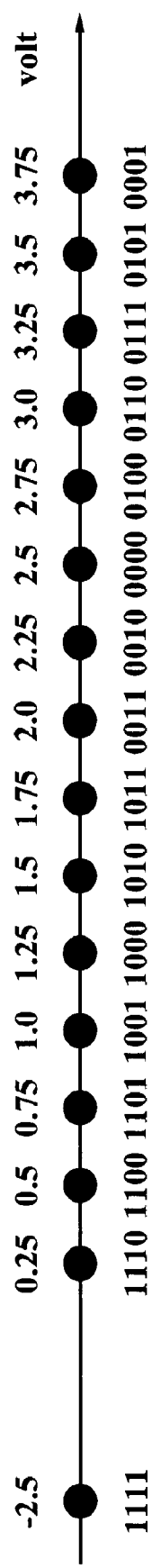

Accordingly, an inner encoded bit stream generated by the TCM modulator 300 of FIG. 3 may include four bits, and the four bits may be signal mapped by the 16 PAM mapper 320. For example, four-bit MLC memory cell may be required to store up to four bits in a single cell. Consequently, the TCM modulator 300 may generate a program pulse 330 that belongs to one of 16 distributions corresponding to 16 bit streams that can be generated by a combination of the four bits, and may apply the generated program pulse 330 to the MLC memory cell 240 of FIG. 2. Referring to FIG. 6, when the inner encoded bit stream is "1000", the TCM modulator 300 of FIG. 3 may increase a threshold of the MLC memory cell 240 of FIG. 2, and may apply the program pulse 330 of FIG. 3 to the MLC memory cell 240 until a voltage level detected from the MLC memory cell 240 becomes, for example, greater than (or greater than or equal to) 1.125 volts and less than (or less than or equal to) 1.375 volts.

Figure 4:
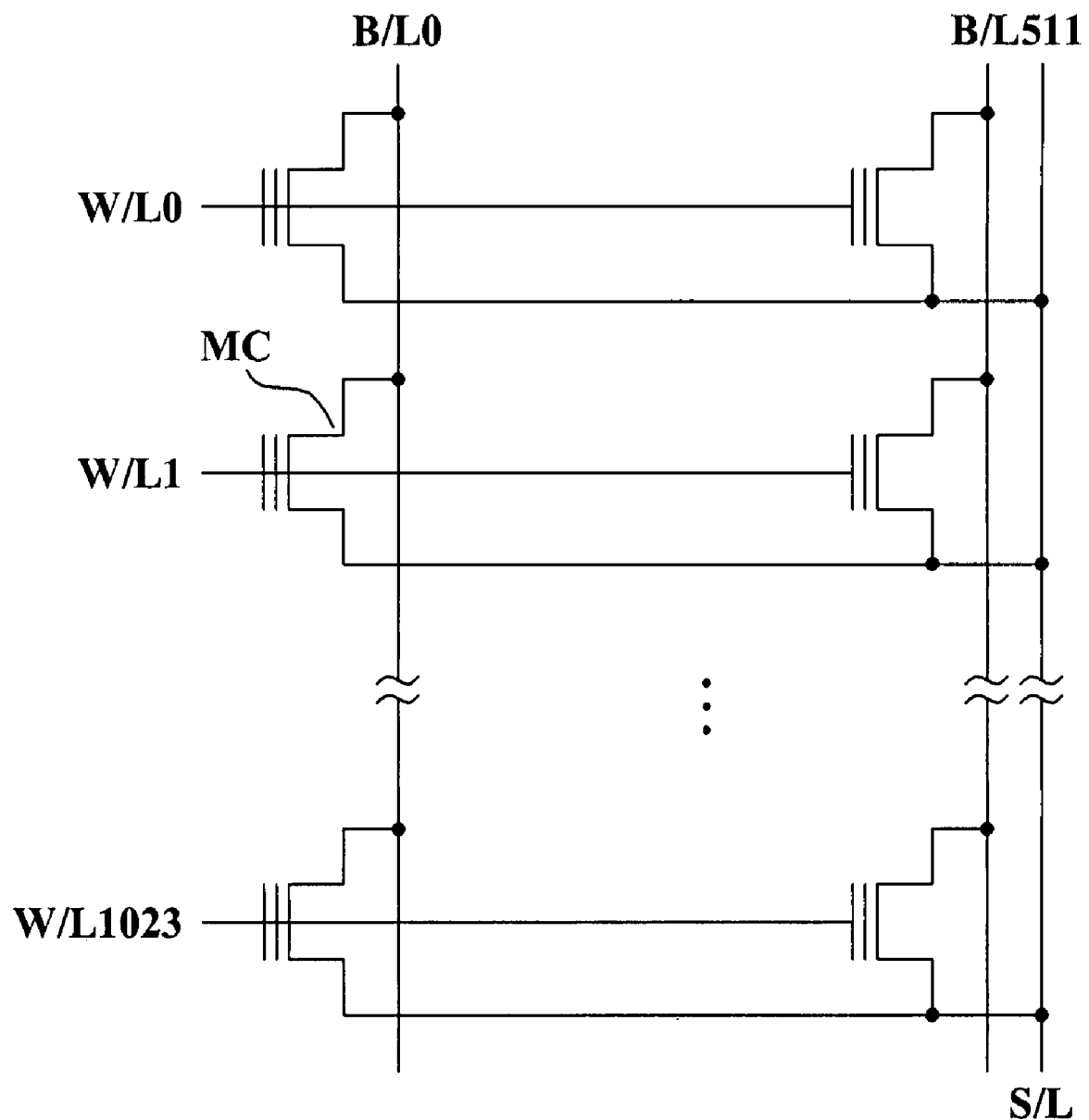
FIG. 4 illustrates a MLC memory cell array according to an example embodiment.

FIG. 4 illustrates a MLC memory cell array according to an example embodiment.

FIG. 4 illustrates a memory cell array of a flash memory corresponding to a MLC memory cell array according to an example embodiment. In FIG. 4, B/L denotes one or more bit lines, SSL denotes one or more string selection lines, W/L denotes one or more word lines, and MC denotes one or more memory cells. The memory cell of the MLC memory cell array, as shown in FIG. 4, may correspond to a MLC memory cell capable of storing two or more bits of data in a single memory cell.

Figure 5:
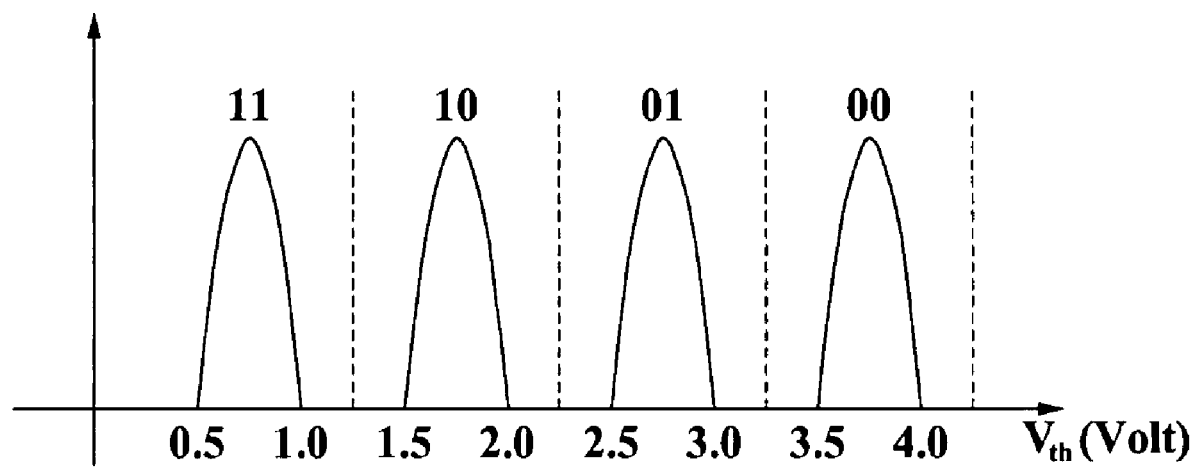
FIGS. 5 and 6 illustrate operation of a TCM modulator according to an example embodiment.

FIGS. 5 and 6 illustrate operation of a TCM modulator according to an example embodiment. In FIG. 5, a signal mapping is performed to store two-bit data in a single memory cell. In FIG. 6, a signal mapping is performed to store four-bit data in a single memory cell.

Referring to FIGS. 2 and 5, when a voltage acquired from the MLC memory cell 240 is greater than (or greater than or equal to) 0.5 volts and less than (or less than or equal to) 1.0 volt, the inner decoder 260 may determine the acquired voltage as a logic "11". When the voltage acquired from the MLC memory cell 240 is greater than (or greater than or equal to) 1.5 volts and less than (or less than or equal to) 2.0 volts, the inner decoder 260 may determine the acquired voltage as a logic "10". When the voltage acquired from the MLC memory cell 240 is greater than (or greater than or equal to) 2.5 volts and less than (or less than or equal to) 3.0 volts, the inner decoder 260 may determine the acquired voltage as a logic "01". When the voltage acquired from the MLC memory cell 240 is greater than (or greater than or equal to) 3.5 volts and less than (or less than or equal to) 4.0 volts, the inner decoder 260 may determine the acquired voltage as a logic "00". Data stored in the MLC memory cell 240 may be classified depending on the difference(s) between cell currents and/or cell voltages when reading the data.

Also, when a bit of the inner encoded bit stream 225 corresponds to a logic "11", the TCM modulator 220 may apply a program pulse to the MLC memory cell 240 so that a voltage level stored in the MLC memory cell 240 may be greater than (or greater than or equal to) 0.5 volts and less than (or less than or equal to) 1.0 volt. In this instance, for example, the program pulse may be generated by PAM. When the bit of the inner encoded bit stream 225 corresponds to a logic "10", the TCM modulator 220 may apply the program pulse to the MLC memory cell 240 so that the voltage level stored in the MLC memory cell 240 may be greater than (or greater than or equal to) 1.5 volts and less than (or less than or equal to) 2.0 volts. When the bit of the inner encoded bit stream 225 corresponds to a logic "01", the TCM modulator 220 may apply the program pulse to the MLC memory cell 240 so that the voltage level stored in the MLC memory cell 240 may be greater than (or greater than or equal to) 2.5 volts and less than (or less than or equal to) 3.0 volts. When the bit of the inner encoded bit stream 225 corresponds to a logic "00", the TCM modulator 220 may apply the program pulse to the MLC memory cell 240 so that the voltage level stored in the MLC memory cell 240 may be greater than (or greater than or equal to) 3.5 volts and less than (or less than or equal to) 4.0 volts.

A case in which the MLC memory cell 240 corresponds to a MLC flash memory cell, and a logic "01" is stored in the MLC memory cell 240 will be described. Before writing in the MLC memory cell 240, the MLC memory cell 240 may be erased. TCM modulator 220 may increase the voltage of the MLC memory cell 240 gradually in a positive direction while increasing a word line voltage gradually. Also, the TCM modulator 220 may verify whether a threshold voltage of the memory cell reaches greater than (or greater than or equal to) 2.5 volts and less than (or less than or equal to) 3.0 volts. To store a logic "01" in the MLC memory cell 240, the MLC memory cell 240 may become a state of logic "01" by sequentially going through a state of logic "11" and a state of logic "10".

FIG. 6 illustrates a signal mapping that may be performed to store four-bit data in a single memory cell. Referring to FIGS. 2 and 6, the TCM modulator 220 may store four-bit data in the single memory cell. When the MLC memory cell 240 corresponds to an m-bit memory cell, the TCM modulator 220 may determine any one of $2^m$ number of levels that may be generated by a $2^m$ PAM, and may apply a program pulse of the determined level to the MLC memory cell 240.

As shown in FIGS. 5 and 6, a voltage window with respect to a single memory cell may be limited. The voltage window of the MLC memory cell 240 may be greater than about −3.0 V and less than about 4.5 V (the lowest voltage shown is about −2.5 volts and the highest voltage shown is about 4.0 volts). In the limited voltage window of FIG. 5, two bits may be stored in a single MLC memory cell and thus four distributions may be formed. Also, in the limited voltage window of FIG. 6, four bits may be stored in the single MLC memory cell and thus 16 distributions may be formed. As described above, to store an 'm' number of bits in a single memory cell, $2^m$ number of distributions should be formed. However, since the voltage window is limited, a threshold voltage difference between neighboring bits decreases as 'm' increases. Accordingly, an error possibility may increase when storing data in and/or reading data from a MLC memory cell. However, according to example embodiments, an error may be detected and/or corrected (or errors may be detected and/or corrected) utilizing a concatenated coding, where an outer coding and an inner coding are concatenated, and thus a dense MLC memory device capable of storing more than four bits in a single memory cell may be achieved.

Figure 7:
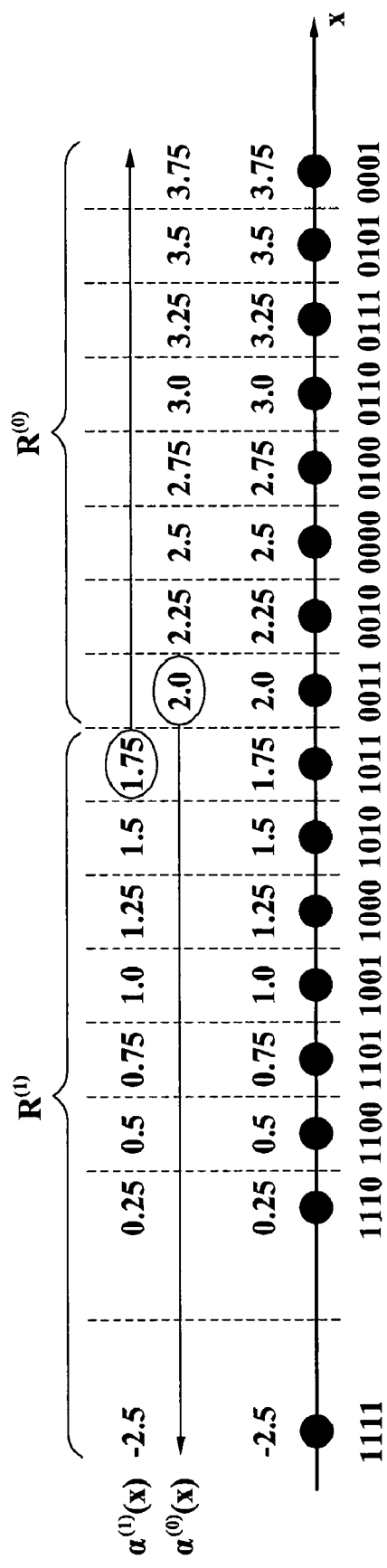
FIG. 7 illustrates operation of an inner decoder performing a soft decision according to an example embodiment.

FIG. 7 illustrates operation of the inner decoder 260 of FIG. 2 performing a soft decision according to an example embodiment.

When the inner decoder 260 performs the soft decision, a demapped bit stream generated by a signal demapping of the inner decoder 260 may include a bit stream that is additionally generated in accordance with Equation 1, $$y_{MSB(soft)} \approx \min_{\alpha^{(0)} \in R^{(0)}} (x - \alpha^{(0)})^2 - \min_{\alpha^{(1)} \in R^{(1)}} (x - \alpha^{(1)})^2 \quad \text{[Equation 1]}$$
$$= (\alpha^{(1)}(x) - \alpha^{(0)}(x)) \times (2x - (\alpha^{(1)}(x) + \alpha^{(0)}(x))).$$

In this instance, $\alpha^{(1)}(x)$ may correspond to a function with a value, as shown in FIG. 7, while a pulse output from the MLC memory cell 240 may include a distribution as shown in FIG. 7. For example, when the pulse output from the MLC memory cell 240 has a value greater than (or greater than or equal to) 1.75 volts, $\alpha^{(1)}(x)$ may have a value of 1.75.

Also, when the pulse output from the MLC memory cell 240 has a value of 0.5 volts, $\alpha^{(1)}(x)$ may have a value of 0.5. In this instance, X indicates a voltage value of the output pulse. Also, $\alpha^{(0)}(x)$ corresponds to a function with a value, as shown in FIG. 7, when the pulse output from the MLC memory cell 240 may include a distribution as shown in FIG. 7. For example, when the pulse output from the MLC memory cell 240 has a value of 2.0 volts, $\alpha^{(0)}(x)$ may have a value of 2.0. Also, when the pulse output from the MLC memory cell 240 has a value of 3.0 volts, $\alpha^{(0)}(x)$ may have a value of 3.0.

A value, calculated by Equation 1, corresponds to additional information about an accuracy of a bit value that is determined by the inner decoder 260 of FIG. 2. When the inner decoder 260 may generate the demapped bit stream by performing a soft decision, from the output pulse 245, the inner decoder 260 may explicitly determine the outer encoded bit stream 215 of FIG. 2, based on the additional information and/or other information.

The above-described example embodiments may be recorded in computer-readable media, including program instructions to implement various operations embodied by a computer. The media also may include, alone or in combination with the program instructions, data files, data structures, and the like. The media and/or program instructions may be those specially designed and/or constructed for the purposes of example embodiments, or they may be of the kind well-known and available to those having ordinary skill in the computer software arts. Examples of computer-readable media include magnetic media such as hard disks, floppy disks, and magnetic tape; optical media such as CD (compact disc) ROM (read-only memory) disks and DVD (digital video disc); magneto-optical media such as optical disks; and/or hardware devices that may be specially configured to store and/or perform program instructions, such as ROM, random access memory (RAM), flash memory, and the like. The media also may be a transmission medium such as optical or metallic lines, wave guides, and the like, including a carrier wave transmitting signals specifying the program instructions, data structures, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments.

For example, any one of the above-described outer encoder 210, the TCM modulator 220, the inner decoder 260, and the outer decoder 270 of FIG. 2 of example embodiments may be embodied in a computer program(s).

As described above, according to example embodiments, a number of bits to store in a single memory cell of a MLC memory may be stably increased by applying a new error correction scheme. In related art, a high storage density of a MLC memory capable of storing more than four bits in a single memory cell of the MLC memory is not provided. However, in example embodiments, the high storage density of a MLC memory capable of storing more than four bits in a single memory cell of the MLC memory is possible.

Although the MLC memory device according to example embodiments may have overhead required for additional circuits, data capacity of the memory may increase more than the overhead.

Also, a related art error correction scheme applied to a MLC memory device may be inapplicable when a raw error rate is high, for example, when a bit error rate (BER) is more than 0.01. However, example embodiments may be applicable even when the raw error rate is high. In related art, when a number of bits to store in a single memory cell of the MLC memory cell increases, a threshold voltage difference between neighboring bits decrease and read-failure rate increases. However, according to example embodiments, the above-described problems may be overcome.

Also, according to example embodiments, it may be possible to reduce a bit error rate when storing data in the MLC memory device utilizing a scheme which performs both encoding and signal mapping when storing data in a MLC memory device.

Also, according to example embodiments, it may be possible to improve reliability of flash memory by correcting an error or errors included in a read signal from a MLC memory device.

Also, according to example embodiments, it may be possible to provide an error correction scheme robust against both random error or errors and burst error or errors in a MLC memory device.

While example embodiments have been particularly shown and described, it will be understood by those of ordinary skill in the art that various changes in form and details may be made therein without departing from the spirit and scope of the present invention as defined by the following claims.

What is claimed is:

1. A multi-level cell (MLC) memory device, comprising:
a MLC memory cell;
an outer encoder that encodes data using a first encoding scheme to generate an outer encoded bit stream;
a trellis coded modulation (TCM) modulator that applies a program pulse to the MLC memory cell to write the data in the MLC memory cell; and
an inner decoder,
wherein the program pulse is generated by TCM modulating the outer encoded bit stream,
the inner decoder generates a demapped bit stream by demapping an output pulse from the MLC, and
wherein the inner decoder generates an inner decoded bit stream by Viterbi decoding the demapped bit stream.

2. The device of claim 1, wherein the first encoding scheme comprises linear block encoding.

3. The device of claim 1, wherein the MLC memory cell is an m-bit MLC memory cell, and
wherein the program pulse is any one of $2^m$ number of levels corresponding to $2^m$ bit streams that can be generated by combination of the m-bits, m being a positive integer.

4. The device of claim 1, wherein the TCM modulator is configured to perform both encoding of the outer encoded bit stream and signal mapping of the outer encoded bit stream.

5. The device of claim 1, wherein the program pulse is based on an inner encoded bit stream generated by the TCM modulator based on the outer encoded bit stream, and the inner encoded bit stream is a systematic code.

6. The device of claim 1, wherein the program pulse is based on an inner encoded bit stream generated by the TCM modulator based on the outer encoded bit stream, and the inner encoded bit stream is a nonsystematic code.

7. The device of claim 1, wherein the inner decoder generates the demapped bit stream from the output pulse by performing a hard decision.

8. The device of claim 1, wherein the inner decoder generates the demapped bit stream from the output pulse by performing a soft decision.

9. The device of claim 1, further comprising:
an outer decoder;

wherein the outer decoder decodes the inner decoded bit stream by a first decoding method to generate an outer decoded bit stream.

10. The device of claim 9, wherein the inner decoder generates the inner decoded bit stream by correcting an error or errors detected from the demapped bit stream, and
wherein the outer decoder generates the outer decoded bit stream by correcting, an error or errors detected from the inner decoded bit stream.

11. The device of claim 9, wherein the outer decoder reports an error that is detected, but uncorrected, in the outer decoded bit stream, or
wherein the outer decoder reports errors that are detected, but uncorrected, in the outer decoded bit stream.

12. The device of claim 1, wherein the MLC memory cell comprises a memory cell of a MLC flash memory.

13. A method of storing data in a multi-level cell (MLC) memory device, the method comprising:
encoding data using a first encoding scheme to generate an outer encoded bit stream; and
applying a program pulse to a MLC memory cell of the MLC memory device to write the data in the MLC memory cell;
generating a demapped bit stream by demapping an output pulse from the MLC;
generating an inner decoded bit stream by Viterbi decoding the demapped bit stream,
wherein the program pulse is generated by Trellis coded modulation of the outer encoded bit stream.

14. The method of claim 13, wherein the first encoding scheme comprises linear block encoding.

15. The method of claim 13, wherein the program pulse is any one of $2^m$ number of levels corresponding to $2^m$ bit streams that can be generated by combination of the m-bits.

16. The method of claim 13, wherein the outer encoded bit stream is a systematic code.

17. The method of claim 13, wherein the outer encoded bit stream is a nonsystematic code.

18. A method of reading data from a multi-level cell (MLC) memory device, the method comprising:
receiving an output pulse from a MLC memory cell of the MLC memory device;
generating an inner decoded bit stream from the output pulse in response to application of a read signal;
generating a demapped bit stream by demapping the output pulse; and
generating the inner decoded bit stream by Viterbi decoding the demapped bit stream.

19. The method of claim 18, wherein the demapped bit stream is generated from the output pulse by performing a hard decision.

20. The method of claim 18, wherein the demapped bit stream is generated from the output pulse by performing a soft decision.

21. The method of claim 18, further comprising:
decoding the inner decoded bit stream by a first decoding scheme to generate an outer decoded bit stream.

* * * * *